(12) United States Patent
Jeon et al.

(10) Patent No.: US 9,898,964 B2
(45) Date of Patent: Feb. 20, 2018

(54) ARRAY SUBSTRATE AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Dong hyup Jeon, Beijing (CN); Bongyeol Ryu, Beijing (CN); Seong Jun An, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 5 days.

(21) Appl. No.: 14/420,795

(22) PCT Filed: Apr. 29, 2014

(86) PCT No.: PCT/CN2014/076466
§ 371 (c)(1),
(2) Date: Feb. 10, 2015

(87) PCT Pub. No.: WO2015/096337
PCT Pub. Date: Jul. 2, 2015

(65) Prior Publication Data
US 2016/0035281 A1    Feb. 4, 2016

(30) Foreign Application Priority Data

Dec. 27, 2013 (CN) .......................... 2013 1 0741942

(51) Int. Cl.
*G09G 5/10* (2006.01)
*G09G 3/3258* (2016.01)
(Continued)

(52) U.S. Cl.
CPC .......... *G09G 3/3258* (2013.01); *G09G 3/006* (2013.01); *G09G 3/2003* (2013.01);
(Continued)

(58) Field of Classification Search
CPC ....... G09G 2320/0276; G09G 2360/16; G09G 2320/0626
See application file for complete search history.

(56) References Cited

U.S. PATENT DOCUMENTS

2002/0125831 A1   9/2002   Inukai et al.
2004/0108976 A1   6/2004   Hansen
(Continued)

FOREIGN PATENT DOCUMENTS

CN    1369916 A    9/2002
CN    1581255 A    2/2005
(Continued)

OTHER PUBLICATIONS

First Chinese Office Action Appln. No. 201310741942.0; dated Aug. 31, 2015.
(Continued)

*Primary Examiner* — Alexander Eisen
*Assistant Examiner* — Mansour M Said
(74) *Attorney, Agent, or Firm* — Ladas & Parry LLP

(57) ABSTRACT

There are provided an array substrate and a display apparatus. The array substrate comprises a voltage driving circuit (1) for driving display pixels to display images, a current sensing circuit (2), and further comprises test pixels (3), a current comparison circuit (4), and a voltage compensation circuit (5), wherein the current sensing circuit (2) is connected to the test pixels (3) and the current comparison circuit (4), and the current comparison circuit (4) is connected to the voltage compensation circuit (5); the current comparison circuit (4) compares the current value of the
(Continued)

current sensed by the current sensing circuit and flowing through the test pixels (3) with a set threshold, and outputs the comparison result to the voltage compensation circuit (5); and the voltage compensation circuit (5) compensates for the driving voltage of the voltage driving circuit (1) when the current value is smaller than the set threshold. The array substrate can compensate for the current of the display pixels to avoid occurrence of the pixel degradation.

15 Claims, 3 Drawing Sheets

(51) Int. Cl.
    *G09G 3/3225*     (2016.01)
    *G09G 3/00*     (2006.01)
    *G09G 3/20*     (2006.01)
    *H01L 27/32*     (2006.01)

(52) U.S. Cl.
    CPC ....... *G09G 3/3225* (2013.01); *G09G 2310/08* (2013.01); *G09G 2320/0242* (2013.01); *G09G 2320/0257* (2013.01); *G09G 2320/043* (2013.01); *G09G 2320/045* (2013.01); *G09G 2330/12* (2013.01); *H01L 27/3269* (2013.01)

(56) References Cited

U.S. PATENT DOCUMENTS

| | | | |
|---|---|---|---|
| 2004/0263445 A1 | 12/2004 | Inukai et al. | |
| 2005/0029968 A1 | 2/2005 | Shimoda | |
| 2005/0110720 A1 | 5/2005 | Akimoto et al. | |
| 2008/0111812 A1* | 5/2008 | Shirasaki | G09G 3/3233 345/212 |
| 2009/0027316 A1* | 1/2009 | Kim | G09G 3/3233 345/80 |
| 2009/0027375 A1* | 1/2009 | Ryu | G09G 3/3208 345/212 |
| 2010/0171853 A1* | 7/2010 | Kondo | H04N 5/378 348/294 |
| 2010/0277513 A1* | 11/2010 | Byun | G09G 3/3233 345/690 |
| 2011/0205221 A1* | 8/2011 | Lin | G09G 3/2092 345/213 |
| 2013/0147693 A1* | 6/2013 | Bae | G09G 3/3208 345/82 |
| 2013/0314394 A1* | 11/2013 | Chaji | G09G 3/00 345/212 |
| 2014/0002332 A1* | 1/2014 | Huang | G09G 3/3233 345/82 |
| 2016/0086537 A1* | 3/2016 | Shin | G09G 3/3225 345/207 |
| 2016/0133175 A1* | 5/2016 | Lee | G09G 3/3208 345/694 |

FOREIGN PATENT DOCUMENTS

| | | |
|---|---|---|
| CN | 1619606 A | 5/2005 |
| CN | 1732497 A | 2/2006 |
| CN | 101359449 A | 2/2009 |
| CN | 103681772 A | 3/2014 |
| KR | 20070013092 A | 1/2007 |

OTHER PUBLICATIONS

International Search Report Appln. No. PCT/CN2014/076466; dated Aug. 28, 2014.
Written Opinion of the International Searching Authority Appln. No. PCT/CN2014/076466; dated Sep. 15, 2014.
Second Chinese Office Action dated Feb. 3, 2016; Appln. No. 201310741942.0.
Third Chinese Office Action dated Jun. 22, 2016; Appln. No. 201310741942.0.
Fourth Chinese Office Action dated Sep. 18, 2016; Appln. No. 201310741942.0.

* cited by examiner

ARRAY SUBSTRATE AND DISPLAY APPARATUS

TECHNICAL FIELD OF THE DISCLOSURE

The present disclosure relates to the field of display technology, and in particular, to an array substrate and a display apparatus.

BACKGROUND

With the development of the display technology, self light-emitting display apparatuses, which are highly visible and do not need backlight, draw more and more attention of people.

The AMOLED (Active Matrix Organic Light Emitting Diode) as a kind of current-type light emitting device is being applied more and more widely for it can meet the requirements of high definition and large size of displays. The AMOLED emits light by a TFT (Thin Film Transistor) generating a driving current to drive an organic light emitting element such as an OLED (Organic Light Emitting Diode) to emit light. The OLED draws much attention due to its advantages such as low power consumption, high brightness, low cost, large angle of view, fast response and so on, and it has been widely used in the field of organic light emitting technology.

There are comprised in an AMOLED display several pixel units arranged in matrix. Each pixel unit comprises a red display pixel, a green display pixel and a blue display pixel. There is provided in each display pixel an organic light emitting element such as OLED, the performance of which influences the display brightness of the display pixel. Since the performance of the organic light emitting element such as OLED may change due to the influence of the environment, the light emitting brightness of the organic light emitting element with changed performance would decrease, which then influences the normal display; therefore, overtime usage will degrade certain pixels. As time goes by, the degraded pixels are always there, causing the image sticking phenomenon to occur in the severely degraded pixel areas, and thus reducing the usage life of the AMOLED display.

SUMMARY

There provide in embodiments of the present disclosure an array substrate and a display apparatus to relieve the image sticking phenomenon in the self light-emitting display apparatus.

According to one aspect of the present disclosure, there is provided an array substrate comprising a voltage driving circuit for driving display pixels to display images, a current sensing circuit, test pixels with the same initial parameter performance as the display pixels, a current comparison circuit, and a voltage compensation circuit, wherein the current sensing circuit is connected to the test pixels and the current comparison circuit, and the current comparison circuit is connected to the voltage compensation circuit;

the current comparison circuit compares the current value of the current sensed by the current sensing circuit and flowing through the test pixels with a set threshold, and outputs the comparison result to the voltage compensation circuit; and the voltage compensation circuit compensates for the driving voltage of the voltage driving circuit when the current value is smaller than the set threshold.

The array substrate provided by an embodiment of the present disclosure comprises test pixels, a current comparison circuit and a voltage compensation circuit, the current comparison circuit compares the current value flowing through the test pixels with the amplitude of a set standard threshold, and when the current value flowing through the test pixels is smaller than the set threshold, the voltage compensation circuit can compensate for the driving voltage of the voltage driving circuit so as to compensate for the current flowing through the display pixels. Therefore, the degradation of specific pixels can be avoided, and thus the occurrence of the image sticking phenomenon can be avoided.

Optionally, in an embodiment of the present disclosure, the test pixels comprise a red test pixel, a green test pixel and a blue test pixel in order to test the current value of the test pixel of every color and realize the compensation for the display pixel of every color.

Optionally, in an embodiment of the present disclosure, the test pixels are a red display pixel, a green display pixel and a blue display pixel in one pixel unit. The process is simplified by directly taking the display pixels as the test pixels to test the current.

Optionally, in an embodiment of the present disclosure, the test pixels are arranged within a non-display area to avoid influence the normal display of the array substrate.

Optionally, in an embodiment of the present disclosure, the test pixels are arranged within a display area, which can simplify the circuit design by directly using existing display arrays as the test pixels.

Optionally, in an embodiment of the present disclosure, the current comparison circuit comprises comparators connected to the red test pixel, the green test pixel and the blue test pixel respectively, wherein positive input terminals of the comparators are respectively connected to the red test pixel, the green test pixel and the blue test pixel, and negative input terminals thereof are connected to a reference voltage.

The circuit implementation is simple by using the comparators to perform current comparison. The test pixel of each color being connected with a comparator enables to perform detection and comparison for the red display array, the green display array and the blue display array separately, avoiding occurrence of the image sticking phenomenon due to the degradation of the display pixel of one color.

Optionally, in an embodiment of the present disclosure, the array substrate further comprises a timer connected to the current comparison circuit, wherein the timer is configured to set a period such that the current comparison circuit compares the current value with the set threshold within the set period.

By setting a timer to make the current comparison circuit compare the current value with the set threshold within the set period, it is possible to save resources and avoid insufficient power supply and influencing the display effect.

Optionally, the voltage compensation circuit is connected to a gamma reference circuit to compensate the driving voltage for driving the voltage driving circuit by adjusting the gamma reference voltage output by the gamma reference circuit, such that the voltage adjustment is more accurate and feasible.

According to another aspect of the present disclosure, there is also provided a display apparatus comprising the above mentioned array substrate.

The array substrate in the display apparatus provided by an embodiment of the present disclosure comprises test pixels, a current comparison circuit and a voltage compensation circuit, the current comparison circuit compares the current value flowing through the test pixels with the amplitude of a set standard threshold, and when the current value flowing through the test pixels is smaller than the set threshold, the voltage compensation circuit can compensate for the driving voltage of the voltage driving circuit so as to compensate for the current flowing through the display pixels. Therefore, the degradation of specific pixels can be avoided, and thus the occurrence of the image sticking phenomenon can be avoided.

DETAILED DESCRIPTION

In the following, clear and complete description will be made on technical solutions of embodiments of the present disclosure in connection with the figures. Obviously, the described embodiments are only part of embodiments of the present disclosure, but not all the embodiments. All other embodiments obtained by those skilled in the art based on the embodiments in the present disclosure without creative work fall in the protection scope of the present disclosure.

In the self light-emitting display apparatus, the current flowing through the organic light emitting element of a display pixel has a predetermined relation with, typically is proportional to, the material characteristic (e.g., the temperature characteristic) of the display pixel. When the display pixels in the self light-emitting display apparatus perform image display, the normally used driving manner is the voltage driving manner. The voltage driving circuit provides a voltage signal representing a grayscale. The voltage signal will be converted into a current signal for driving the diodes inside the pixel circuit, i.e., the driving voltage is converted into specific driving current. The driving current flows through the organic light emitting element in the display pixel to make the latter emit light, thereby causing the display pixel to perform the image display.

When the pixel degrades, it is usually revealed by the change in the temperature characteristic. The temperature of the pixel is proportional to the current flowing through the display pixel. When the current is lower than required specific current, heating will occur. In order to monitor the amplitude of the current flowing through the display pixel, a current sensing circuit will be provided in the array substrate. The current flowing through the display pixel is detected by the current sensing circuit. The main function of the current sensing circuit is to convert the output or input current into a voltage signal and transfer the voltage signal to a processing module for further processing.

In an embodiment of the present disclosure, it is possible to determine whether current pixel is a degraded pixel by detecting the amplitude of the current flowing through the display pixel. When the current pixel is a degraded pixel, its current can be compensated for by a compensation driving voltage to avoid pixel degradation.

Figure 1:
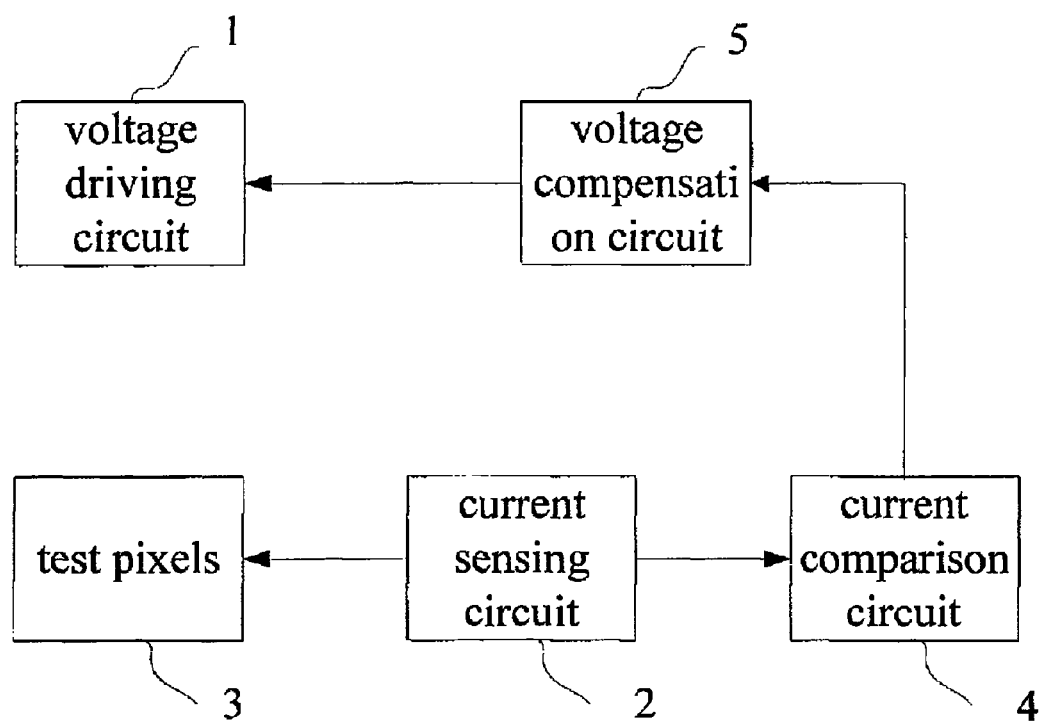
FIG. 1 is a schematic configuration diagram of an array substrate provided in an embodiment of the present disclosure.

FIG. 1 is a schematic configuration diagram of an array substrate provided in an embodiment of the present disclosure. As shown in FIG. 1, the array substrate comprises a voltage driving circuit 1, a current sensing circuit 2, test pixels 3 with the same initial parameter performance as display pixels, current comparison circuit 4 and a voltage compensation circuit 5.

The voltage driving circuit 1 is used for driving the display pixels to display images. The current sensing circuit 2 is connected to the test pixels to determine the current flowing through the test pixels 3. The current sensing circuit 2 is also connected to the current comparison circuit 4 to output the sensed current flowing through the test pixels 3 to the current comparison circuit 4. The current comparison circuit 4 compares the current value of the current sensed by the current sensing circuit 2 and flowing through the test pixels 3 with a set threshold, and outputs the comparison result to the voltage compensation circuit 5 connected to the current comparison circuit 4. The voltage compensation circuit 5 compensates for the driving voltage of the voltage driving circuit 1 for driving the display pixels to display images when the current value is smaller than the set threshold.

In an embodiment of the present disclosure, the set threshold to be compared with the current value of the current flowing through the test pixels 3 is a corresponding current value reflecting the reference material temperature characteristic of the display pixels, which is a fixed current value after the display pixels are fabricated. The current value of the test pixels sensed by the sensing circuit is compared with the set threshold. When the current value is smaller than the set threshold, it is indicated that the display pixel is a degraded pixel and needs to be compensated, and at this time the driving current is compensated. When the current value is larger than the set threshold, it is indicated that the display pixel is a normal display pixel and the current compensation is not needed, and the original driving voltage can be maintained.

Since the characteristics of the materials for fabricating the red display pixel, the green display pixel and the blue display pixel in the pixel unit are different from each other, the degradation degrees of the display pixels of different colors may be different. The test pixels 3 in an embodiment of the present disclosure comprises a red test pixel, a green test pixel and a blue test pixel to make the display pixel of each color have a corresponding test pixel. Therefore, the red display pixel, the green display pixel and the blue display pixel can be detected and compensated separately, avoiding the occurrence of the image sticking phenomenon due to the degradation of the display pixel of one color.

An embodiment of the present disclosure can directly take display pixels as the test pixels without separately fabricating test pixels. Alternatively, in an embodiment of the present disclosure, the red display pixel, the greed display pixel and the blue display pixel in one pixel unit can be taken as the test pixels. The current sensing circuit 2 directly detects the current in the display pixels and then the current comparison circuit performs comparison of the current value.

Alternatively, in an embodiment of the present disclosure, in order not to influence normal display of display pixels in the display area, it is possible to separately add a red test pixel, a green test pixel and a blue test pixel with the same performance as the red display pixel, the green display pixel and the blue display pixel. That is, the current value fed back from the test pixels reflects the current value flowing through the display pixels, and the current value of the display pixels is compensated for by sensing the current value of the separately added test pixels via the current sensing circuit.

In an embodiment of the present disclosure, the separately added test pixels are fabricated by the same material and same process as the display pixels, and completely simulate the display pixels operationally and functionally. That is, the separately added test pixels have the same performance as the display pixels. The current sensing circuit 2 directly senses the current value of the separately added test pixels and outputs it to the current comparison circuit. The current comparison circuit compares the current value of the test pixel with a set threshold. If the current value is smaller than the set threshold, it is indicated that current display pixel corresponding to the test pixel is a degraded pixel and needs current compensation. The voltage compensation circuit compensates for the driving voltage of the voltage driving circuit for driving the display pixel to display image.

Further, in an embodiment of the present disclosure, the test pixels can be added in any space of the array substrate. Of course, in an embodiment of the present disclosure, the test pixels can be arranged in a non-display area to avoid their influence on the normal display of the array substrate. Alternatively, in an embodiment of the present disclosure, the test pixels can be arranged in a display area. When existing display pixels are used as the test pixels, it is not necessary to arrange too long peripheral lead wires, whereby the circuit design is simplified.

Further, the current comparison circuit 4 in an embodiment of the present disclosure can be a current comparison circuit configured of comparators by which the current value of the current sensed by the current sensing circuit 2 and flowing through the test pixel is compared with the set threshold. The implementation of such a circuit is simple. If the result of the comparison by the comparator is that the current value of the test pixel is not smaller than the set threshold, the amplitude of the driving voltage is not to be changed but the original driving voltage amplitude is maintained. If the result of the comparison by the comparator is that the current value of the test pixel is smaller than the set value, a new driving voltage is set to compensate for the driving voltage.

Figure 2:
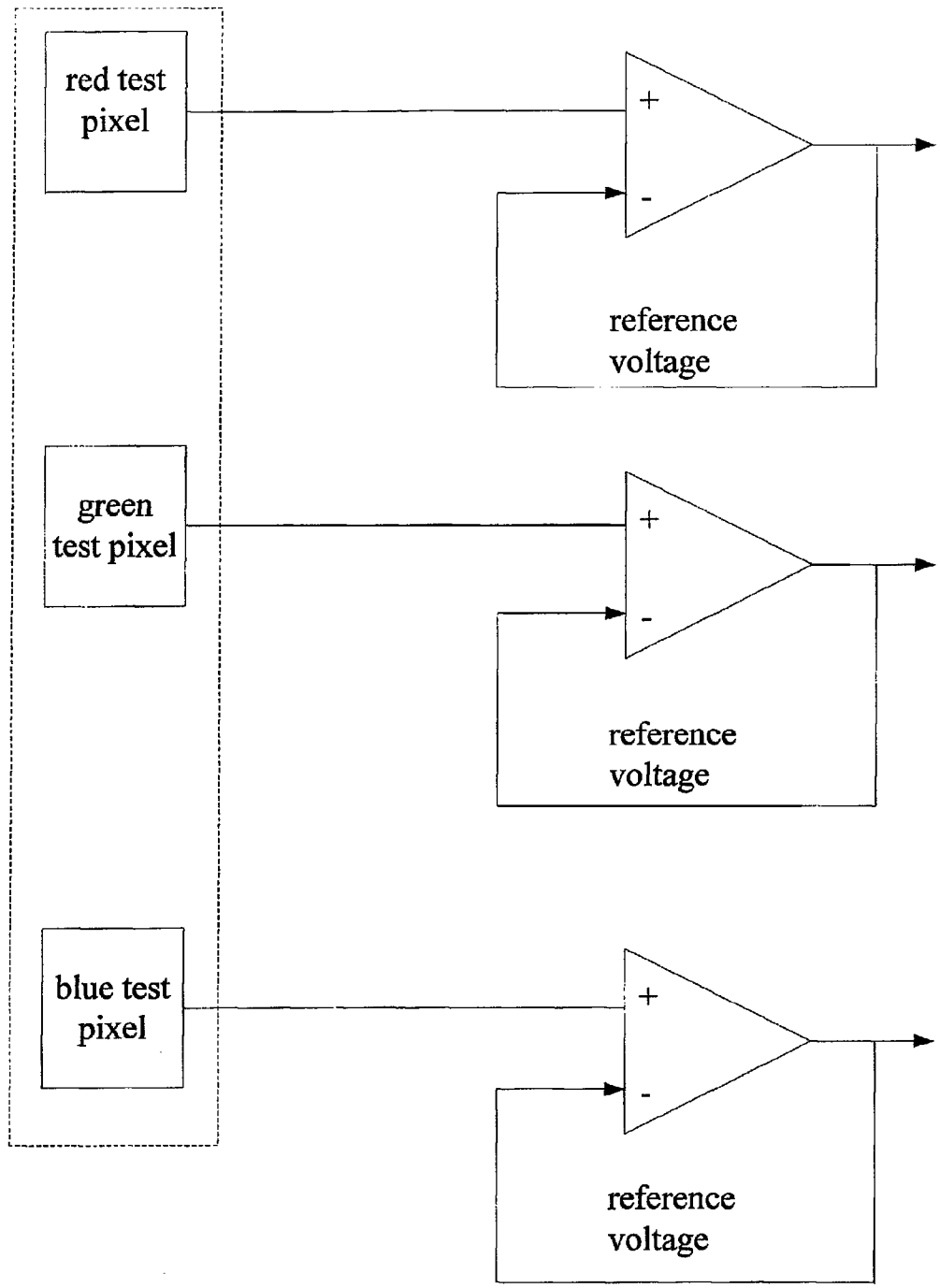
FIG. 2 is a schematic circuit diagram for performing detection and compensation on the display pixel of each color in an embodiment of the present disclosure.

Further, as shown in FIG. 2, in an embodiment of the present disclosure, the current comparison circuit comprises comparators connected to the red test pixel, the green test pixel and the blue test pixel respectively. In FIG. 2, the test pixel of each color is connected with one comparator, the positive input terminal of each comparator is connected respectively to the red test pixel, the green test pixel or the blue test pixel, and the negative input terminals are connected respectively with a reference voltage which can be a fixed value originally set or an updated driving voltage. By the circuit structure shown in FIG. 2, it is possible to detect and compensate for the red display pixel, the green display pixel and the blue display pixel separately to avoid occurrence of the image sticking phenomenon due to the degradation of the display pixel of one color thereof.

Figure 3:
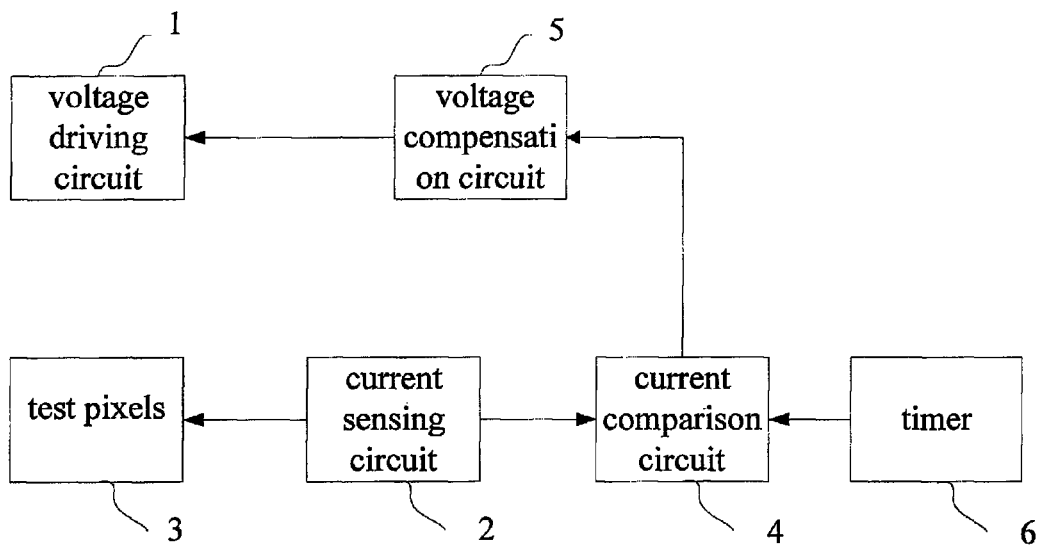
FIG. 3 is a schematic configuration diagram of another array substrate provided in an embodiment of the present disclosure.

Alternatively, as shown in FIG. 3, in an embodiment of the present disclosure, a timer 6 connected to the current comparison circuit 4 can be provided. A period is set by the timer 6 such that the current comparison circuit compares the current value flowing through the test pixel with the set threshold within the set period, to save resources and prevent insufficient power supply from influencing the display effect.

It should be noted that embodiments of the present disclosure can set the period by other ways such as reset and re-power up, which are not limited by embodiment of the present disclosure.

Further, when the compensation circuit in an embodiment of the present disclosure adjusts the driving voltage, it can be implemented by directly adjusting the source voltage or adjusting the gamma reference voltage.

Figure 4:
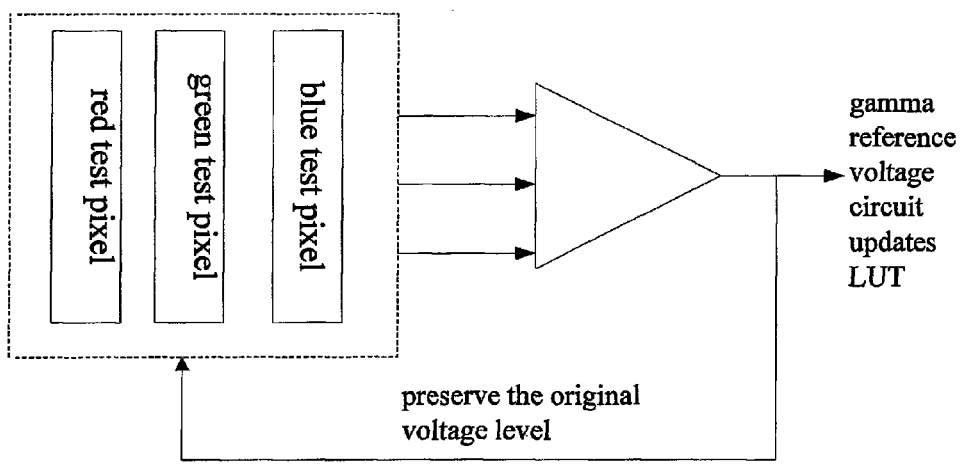
FIG. 4 is a schematic diagram of voltage compensation process according to an embodiment of the present disclosure.

As shown in FIG. 4, in the present embodiment, the driving voltage is adjusted by the gamma reference voltage. The voltage compensation circuit 5 is connected to a gamma reference circuit. When the current value is smaller than the set threshold, a new voltage level is set to update the pixel grayscale LUT (Look Up Table). Thereby, the purpose of adjusting the driving voltage is achieved by adjusting the gamma reference voltage output by the gamma reference circuit. When the current value is larger than the set threshold, the original voltage level is maintained.

Alternatively, in an embodiment of the present disclosure, the threshold can be further refined to set multiple thresholds. When the current value is larger than one threshold, the set threshold can be changed to another threshold, and remains for a period of time until the another threshold is exceeded, and then adjustment is performed again. This enables the current of the display pixel to be compensated for more accurately.

In an embodiment of the present disclosure, when employing multiple set thresholds, because there may exist shift and environmental temperature influence on the input voltage, the current flowing through the display pixel would not change significantly, but a threshold set error may occur. Therefore, in the current comparison circuit of an embodiment of the present disclosure, a Schmitt trigger can be provided to detect the error. The Schmitt trigger can shape the slowly varying input signal into a rectangle pulse with sharp edges. The Schmitt trigger has two threshold voltages which are a positive direction threshold voltage and a negative direction threshold voltage respectively. The voltage transfer characteristic curve of the Schmitt trigger has a Hysteresis region. When an error range is defined, the Schmitt trigger can be used to compensate for the drawback of the threshold error.

An embodiment of the present disclosure also provides a display apparatus comprising any array substrates as described in the above.

It is note that the display apparatus related in embodiments of the present disclosure can be any product or part with display function, such as a liquid crystal display panel, an electronic paper, an OLED panel, a cell phone, a flat pad computer, a TV set, a display, a notebook computer, a digital photo frame, a navigator and so on.

The array substrate in the display apparatus provided by an embodiment of the present disclosure comprises test pixels, a current comparison circuit and a voltage compensation circuit, the current comparison circuit compares the current value flowing through the test pixels with the amplitude of a set standard threshold, and when the current value flowing through the test pixels is smaller than the set threshold, the voltage compensation circuit can compensate for the driving voltage of the voltage driving circuit so as to compensate for the current flowing through the display pixels. Therefore, the degradation of specific pixels can be avoided, and thus the occurrence of the image sticking phenomenon can be avoided.

Obviously, those skilled in the art can make various changes and variations to embodiments of the present disclosure without departing from the spirit and scope of the present disclosure. As such, if those changes and variations to the embodiments of the present disclosure fall within the scope of the claims of the present disclosure and equivalents thereof, the present disclosure is intended to contain those changes and variations.

What is claimed is:

1. An array substrate comprising:
a voltage driving circuit for driving display pixels to display images;
a current sensing circuit;
test pixels with the same initial parameter performance as the display pixels;
a current comparison circuit; and
a voltage compensation circuit, wherein
the current sensing circuit is connected to the test pixels and the current comparison circuit, and the current comparison circuit is connected to the voltage compensation circuit;
the current comparison circuit compares the current value of the current sensed by the current sensing circuit and flowing through the test pixels with a set threshold, the set threshold being a corresponding current value reflecting the reference material temperature characteristic of the display pixels, determines the display pixels are degraded pixels when the current value is smaller than the set threshold, and outputs the comparison result to the voltage compensation circuit;
the voltage compensation circuit compensates for the driving voltage of the voltage driving circuit when the display pixels are degraded pixels; and
a timer connected to the current comparison circuit, wherein
the timer is configured to set a period such that the current comparison circuit compares the current value with the set threshold within the set period.

2. The array substrate of claim 1, wherein the test pixels comprise a red test pixel, a green test pixel and a blue test pixel.

3. The array substrate of claim 2, wherein the test pixels are a red display pixel, a green display pixel and a blue display pixel in one pixel unit.

4. The array substrate of claim 2, wherein the test pixels are arranged within a non-display area.

5. The array substrate of claim 2, wherein the test pixels are arranged within a display area.

6. The array substrate of claim 2, wherein the current comparison circuit comprises comparators connected to the red test pixel, the green test pixel and the blue test pixel respectively, wherein
positive input terminals of each of the comparators are respectively connected to the red test pixel, the green test pixel and the blue test pixel, and negative input terminals thereof are connected to a reference voltage.

7. The array substrate of claim 1, wherein the voltage compensation circuit is connected to a gamma reference circuit to compensate the driving voltage for driving the voltage driving circuit by adjusting a gamma reference voltage output by a gamma reference circuit.

8. A display apparatus comprising an array substrate according to claim 1.

9. The display apparatus of claim 8, wherein the test pixels comprise a red test pixel, a green test pixel and a blue test pixel.

10. The display apparatus of claim 9, wherein the test pixels are a red display pixel, a green display pixel and a blue display pixel in one pixel unit.

11. The display apparatus of claim 9, wherein the test pixels are arranged within a non-display area.

12. The display apparatus of claim 9, wherein the test pixels are arranged within a display area.

13. The display apparatus of claim 9, wherein the current comparison circuit comprises comparators connected to the red test pixel, the green test pixel and the blue test pixel respectively, wherein
positive input terminals of each of the comparators are respectively connected to the red test pixel, the green test pixel and the blue test pixel, and negative input terminals thereof are connected to a reference voltage.

14. The display apparatus of claim 8, further comprising a timer connected to the current comparison circuit, wherein
the timer is configured to set a period such that the current comparison circuit compares the current value with the set threshold within the set period.

15. The display apparatus of claim 8, wherein the voltage compensation circuit is connected to a gamma reference circuit to compensate for the driving voltage for driving the voltage driving circuit by adjusting a gamma reference voltage output by a gamma reference circuit.

* * * * *